United States Patent
Tanaka et al.

(10) Patent No.: US 12,237,096 B2
(45) Date of Patent: Feb. 25, 2025

(54) CONNECTION STRUCTURE, METHOD OF MANUFACTURING CONNECTION STRUCTURE, CONNECTION MATERIAL, AND COATED CONDUCTIVE PARTICLE

(71) Applicant: DEXERIALS CORPORATION, Shimotsuke (JP)

(72) Inventors: Yusuke Tanaka, Tochigi (JP); Masaharu Aoki, Tochigi (JP); Saori Sugioka, Tochigi (JP); Hidetsugu Namiki, Tochigi (JP); Shoko Kuga, Tochigi (JP)

(73) Assignee: DEXERIALS CORPORATION, Shimotsuke (JP)

( * ) Notice: Subject to any disclaimer, the term of this patent is extended or adjusted under 35 U.S.C. 154(b) by 554 days.

(21) Appl. No.: 17/607,466

(22) PCT Filed: Apr. 23, 2020

(86) PCT No.: PCT/JP2020/017582
§ 371 (c)(1),
(2) Date: Oct. 29, 2021

(87) PCT Pub. No.: WO2020/222301
PCT Pub. Date: Nov. 5, 2020

(65) Prior Publication Data
US 2022/0223315 A1      Jul. 14, 2022

(30) Foreign Application Priority Data

May 1, 2019    (JP) ................................. 2019-087150
Apr. 23, 2020  (JP) ................................. 2020-076961

(51) Int. Cl.
*H01B 1/22*     (2006.01)
*H01B 5/16*     (2006.01)

(52) U.S. Cl.
CPC ................. *H01B 1/22* (2013.01); *H01B 5/16* (2013.01)

(58) Field of Classification Search
CPC ... H01B 1/22; H01B 5/16; H01B 1/00; H01R 11/01; H04N 23/00; H05K 3/32; G03B 17/02
(Continued)

(56) References Cited

U.S. PATENT DOCUMENTS 11,810,706 B2 *  11/2023  Sasajima ................. H01F 27/06
2013/0258568 A1 * 10/2013  Iwata ...................... G06F 3/0446
                                                          361/679.01
(Continued)

FOREIGN PATENT DOCUMENTS

JP    2001-220691 A    8/2001
JP    2005-317270 A   11/2005
(Continued)

OTHER PUBLICATIONS

Nov. 21, 2023 Office Action issued in Taiwanese Patent Application No. 109114319.
(Continued)

*Primary Examiner* — Alexander Gilman
(74) *Attorney, Agent, or Firm* — Oliff PLC

(57) ABSTRACT

A connection structure, a method of manufacturing the connection structure, a connection material, and a coated conductive particle capable of reducing and stabilizing a conduction resistance value. The connection structure includes: a first electronic component having a first terminal; a second electronic component having a second terminal, and a cured film provided between the first electronic component and the second electronic component and formed by curing the connection material, wherein, with regard to the coated conductive particles between the first terminal
(Continued)

and the second terminal, metal atoms of the conductive layer diffuse into the metal of the metal fine particles, and metal atoms of the first terminal and the metal atoms of the second terminal diffuse into the metal of the metal fine particles.

16 Claims, 7 Drawing Sheets

(58) Field of Classification Search
USPC .......................................................... 439/66
See application file for complete search history.

(56) References Cited

U.S. PATENT DOCUMENTS

| | | | |
|---|---|---|---|
| 2013/0313672 A1* | 11/2013 | Min | G02B 5/22 257/434 |
| 2014/0092298 A1* | 4/2014 | Kim | G03B 17/02 348/374 |
| 2014/0249526 A1* | 9/2014 | Kotov | A61L 31/125 252/514 |
| 2015/0017457 A1* | 1/2015 | Mizuno | B32B 27/08 252/514 |
| 2015/0200037 A1* | 7/2015 | Inoue | H01B 1/22 252/514 |
| 2015/0325721 A1* | 11/2015 | Toda | H01L 27/14643 348/294 |
| 2016/0351290 A1* | 12/2016 | Kim | H01B 1/22 |
| 2017/0307842 A1* | 10/2017 | Nakamura | H04N 23/54 |
| 2018/0270404 A1* | 9/2018 | Ishida | H04N 23/45 |
| 2019/0124277 A1* | 4/2019 | Mabuchi | B60R 1/27 |
| 2019/0141224 A1* | 5/2019 | Park | H04N 23/54 |
| 2019/0185656 A1* | 6/2019 | Ogawa | C08L 33/10 |
| 2020/0004039 A1* | 1/2020 | Ogasahara | H04N 23/00 |
| 2020/0269315 A1* | 8/2020 | Dobashi | B22F 1/06 |

FOREIGN PATENT DOCUMENTS

| | | |
|---|---|---|
| JP | 2013-041683 A | 2/2013 |
| JP | 2014-143189 A | 8/2014 |
| JP | 2018-046010 A | 3/2018 |
| JP | 2018-145418 A | 9/2018 |
| KR | 10-2015-0081368 A | 7/2015 |
| TW | 201915215 A | 4/2019 |
| WO | WO2016/080289 A1 | 6/2008 |

OTHER PUBLICATIONS

Jun. 18, 2024 Office Action issued in Korean Patent Application No. 10-2021-7035504.
Feb. 26, 2024 Office Action issued in Korean Patent Application No. 10-2021-7035504.
Jul. 14, 2020 International Search Report issued in International Patent Application No. PCT/JP2020/017582.
May 15, 2023 Office Action issued in Taiwanese Patent Application No. 109114319.
Jul. 27, 2023 Office Action issued in Korean Patent Application No. 10-2021-7035504.
Mar. 31, 2023 Office Action issued in Chinese Patent Application No. 202080032355.2.

* cited by examiner

CONNECTION STRUCTURE, METHOD OF MANUFACTURING CONNECTION STRUCTURE, CONNECTION MATERIAL, AND COATED CONDUCTIVE PARTICLE

TECHNICAL FIELD

The present technology relates to a connection structure in which electronic components are connected, a method of manufacturing a connection structure, a connection material, and coated a conductive particle. This application claims priority based on Japanese Patent Application Serial No. 2019-087150 filed on May 1, 2019 and Japanese Patent Application Serial No. 2020-076961 filed on Apr. 23, 2020, which are incorporated herein by reference.

BACKGROUND ART

Conventionally, a connection material containing conductive particles is used in an electrical connection such as a circuit. As the conductive particles, there have been known, for example, those having an uneven surface (see, for example, Patent Document 1), those having a surface coated with a metal filler (see, for example, Patent Document 2), and those having a surface coated with an insulating filler (see, for example, Patent Document 3).

In recent years, since objects to be connected using conductive particles have been diversified, besides the improvement of insulation performance, the conduction resistance value is required to be reduced and stabilized. However, despite of such a demand, there are cases in which conventional conductive particles might have a large conduction resistance value and a variation of the conduction resistance value after the reliability test.

PRIOR ART REFERENCE

Patent Reference

Patent Document 1: Japanese Unexamined Patent Application Publication No. 2005-317270
Patent Document 2: Japanese Unexamined Patent Application Publication No. 2013-041683
Patent Document 3: Japanese Unexamined Patent Application Publication No. 2018-145418

SUMMARY OF THE INVENTION

Problem to be Solved by the Invention

The present technology has been proposed in view of such conventional circumstances, and provides a connection structure, a method of manufacturing the connection structure, a connection material, and a coated conductive particle capable of reducing and stabilizing the conduction resistance value.

Means of Solving the Problem

A connection structure according to the present technology includes: a first electronic component having a first terminal; a second electronic component having a second terminal; and a cured film provided between the first electronic component and the second electronic component and formed by curing a connection material containing coated conductive particles comprising a core material particle, a conductive layer provided on the surface of the core material particle, and metal fine particles coating the surface of the conductive layer, wherein, with regard to the coated conductive particles between the first terminal and the second terminal, metal atoms of the conductive layer diffuse into the metal of the metal fine particles, and metal atoms of the first terminal and metal atoms of the second terminal diffuse into the metal of the metal fine particles.

A method of manufacturing a connection structure according to the present technology includes: thermocompression-bonding a first electronic component having a first terminal and a second electronic component having a second terminal at a predetermined temperature via a connection material containing coated conductive particles comprising a core material particle, a conductive layer provided on the surface of the core material particles, and metal fine particles coating the surface of the conductive layer; and with regard to the coated conductive particles between the first terminal and the second terminal, diffusing metal atoms of the conductive layer into the metal of the metal fine particles, and diffusing metal atoms of the first terminal and metal atoms of the second terminal into the metal of the metal fine particles.

A connection material according to the present technology includes: an insulating binder in which coated conductive particles comprising a core particles, a conductive layer provided on the surface of the core particles, and a metal particle covering the surface of the conductive layer are dispersed, wherein metal atoms of the conductive layer diffuse into the metal of the metal fine particles at a predetermined temperature for thermocompression bonding.

A coated conductive particle according to the present technology includes: a core particle; a conductive layer provided on the surface of the core particle; and metal fine particles coating the surface of the conductive layer, wherein metal atoms of the conductive layer diffuse into the metal of the metal fine particles at a predetermined temperature for thermocompression bonding.

Effects of the Invention

According to the present technology, during thermocompression bonding, with regard to the coated conductive particles between the terminals, metal atoms of the conductive layer diffuse into the metal of the metal fine particles and metal atoms of the terminals also diffuse into the metal of the metal fine particles so that the conduction resistance value can be reduced and stabilized.

MODE FOR CARRYING OUT THE INVENTION

Figure 1:
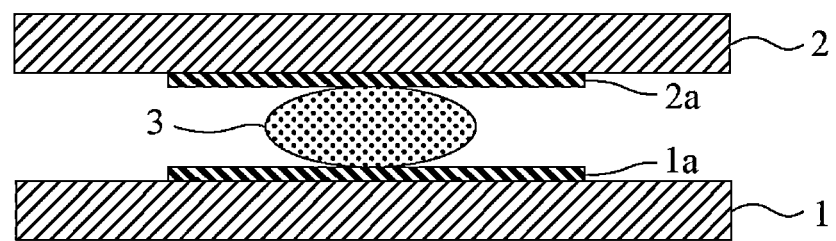
FIG. 1 is a cross-sectional view schematically illustrating a connection structure.

Embodiments of the present invention will now be described in detail in the following order with reference to the drawings.
1. Coated conductive particle
2. Connection material
3. Manufacturing method of connection material
4. Connection structure
5. Manufacturing method of connection structure
6. Examples 1. Coated Conductive Particle A coated conductive particle according to the present embodiment include a core material particle, a conductive layer provided on the surface of the core material particle, and metal fine particles coating the surface of the conductive layer, wherein metal atoms of the conductive layer diffuse into the metal of the metal fine particles at a predetermined temperature for thermocompression bonding.

The term "diffuse" as used herein means diffusion of metal atoms of a conductive layer or metal atoms of a terminal of an electronic component into the metal of a metal fine particle or diffusion of metal atoms of a metal fine particle into the metal of a conductive layer or into the metal of a terminal of an electronic component by heat, pressure, or deformation, among others. Such a diffusion state can be observed by using a field-emission transmission electron microscope (FE-TEM) and an energy dispersive X-ray analyzer (EDS) to perform line analysis or elemental mapping of the contact portion between the coated conductive particles and the terminal of the electronic component.

Examples of the core particle include resin particles, organic-inorganic hybrid particles, and metal particles. Examples of the resin constituting the resin particle include a styrene-divinylbenzene copolymer, a benzoguanamine resin, a cross-linked polystyrene resin, an acrylic resin, and a styrene-silica composite resin. Examples of the organic-inorganic hybrid particle include a particle formed of a crosslinked alkoxysilyl polymer and an acrylic resin. Examples of the metal particle include nickel, cobalt, silver, copper, gold, palladium, and solder. Among these, resin particles or organic-inorganic hybrid particles having excellent stress relaxation properties are preferably used.

The conductive layer is provided on the surface of the core material particle. It is preferable that the metal of the conductive layer diffuses into the metal of the metal fine particles at a predetermined temperature for thermocompression bonding; however, the metal of the conductive layer may not diffuse into the metal of the metal fine particles as long as it can achieve conductivity by contact with metal fine particles. The predetermined temperature for thermocompression bonding is, for example, 200° C. or less, preferably 160° C. or less, and more preferably 140° C. or less. The metal of the conductive layer can be appropriately selected according to the metal of the metal fine particles. The conductive layer is preferably a single metal or alloy of at least any one of nickel, silver, copper, gold, and palladium. The conductive layer may be solder. If the core particle is a metal particle, the conductive layer is preferably a single metal or alloy of at least one of gold and palladium to prevent surface oxidation. From the viewpoint of conductivity and surface oxidation, the conductive layer preferably has a first conductive layer and a second conductive layer on the surface of the core material particles in this order, the first conductive layer is preferably a nickel plating layer, and the second conductive layer is preferably a gold plating layer.

The thickness of the conductive layer is preferably from 50 nm to 300 nm, more preferably from 80 nm to 250 nm. When the conductive layer is composed of a plurality of metal layers, the total thickness preferably satisfies the above range. If the conductive layer is too thin, it becomes difficult to make it to function as a conductive particle. When the core particle is a metal particle, the surface of the core particle can be regarded as a conductive layer, and the thickness of the conductive layer need not be taken into consideration. Herein, the term "conductive particle" designates those composed of a core particle and a conductive layer regardless of the type of the core particle. It should be noted that a core particle having a resin particle as the core particle may be referred to as "resin core conductive particle".

The conductive particles preferably have a plurality of protrusions on the surface of the conductive layer. The structure of the conductive particles having protrusions is not particularly limited as long as the surface of the conductive layer has a shape having protrusions, and may include the following first to third configuration examples. The first configuration example includes: a core particle; plurality of insulating particles adhered to the surface of the core particle and serving as a core of the projections; and a conductive layer covering the core particle and the insulating particles. The second configuration example includes: a core particle; plurality of insulating particles adhered to the surface of the core particle and serving as a core of the projections; a first conductive layer covering the surfaces of the core particle and the insulating particles; and a second conductive layer covering the first conductive layer. The third configuration example includes: a core material particle, a first conductive layer covering the surface of the core material; a plurality of insulating particles adhered to the surface of the first conductive layer and serving as the core material of projections; and a second conductive layer covering the surfaces of the first conductive layer and the insulating particles. By providing a plurality of protrusions on the surface of the conductive layer, the adhesion amount of the metal fine particles can be increased with the protrusions serving as a core, thereby further reducing and stabilizing the conduction resistance value. In addition, the protrusions bite into the surface of the terminal to be connected, thereby enhancing the effect of diffusion of metal atoms of particles covering the conductive layer and the surface of the terminal. This can be inferred from various reasons such as that the pressure to the metal fine particles covering the conductive layer is increased by the protrusions and that the contact area is simply increased.

The lower limit of the particle diameter of the conductive particles is preferably 2 μm or more. The upper limit of the particle diameter of the conductive particles is not particularly limited, but is preferably, for example, 50 μm or less, more preferably 20 μm or less, from the viewpoint of the trapping efficiency of the conductive particles in the connection structure. The particle diameter of the conductive particles may be a value measured by an image type particle diameter distribution meter (for example, FPIA-3000:

manufactured by Malvern). The number of the particles is preferably 1,000 or more, preferably 2,000 or more.

The metal fine particles cover the surface of the conductive layer provided on the surface of the core material particle. The metal of the metal fine particles can be appropriately selected according to the metal of the conductive layer and the metal of the terminal of the electronic component. The metal fine particles are preferably a single metal or an alloy of at least any one of nickel, silver, copper, gold, and palladium. The metal fine particles may be solder. Among these, silver or a silver alloy is preferable from the viewpoint of reducing resistance.

The upper limit of the particle diameter of the metal fine particles may be 14% or less, preferably 0.3% or less of that of the conductive particle. Alternatively, this is preferably 100 nm or less, and more preferably 80 nm or less. Thus, the metal of the conductive layer and the metal of the terminal of the electronic component can diffuse into the metal of the metal fine particles by thermocompression bonding. Further, since the particle diameter of the metal fine particles is not too large relative to the surface area of the conductive particles, it is possible to suppress defects such as damage to the surface of the conductive particles. The lower limit of the particle diameter of the metal fine particles may be 2 nm or more, preferably 10 nm or more. Since the metal fine particles are not too small relative to the surface area of the conductive particles, aggregation of the conductive particles can be more effectively suppressed. If the metal particles are too small, there is a concern that the viscosity of the connection material may increase too much, thereby affecting the dispersibility. It should be noted that the particle diameter of the metal fine particles can be observed, for example, by an electron microscope (for example, TEM) and can be an average value of arbitrary 100 particles, and the accuracy can be further improved by determining the particle diameter as an average value of arbitrary 200 or more particles.

As for the coated conductive particles, as described above, solder particles can be suitably used as the metal particles. The solder particles preferably cover the surface of the resin core conductive particle described above. By using the resin core conductive particle, the resin core of the resin core conductive particle deforms and repels at the time of connection, thereby facilitating a uniform connection state. In general, the resin core conductive particle has less variation in particle diameter than metal particles. Specifically, the coefficient of variation (CV value) of the resin core conductive particle is 20% or less, preferably 10% or less, and more preferably 5% or less. Small variation of the particle diameter tends to equalize the pressure applied to the resin core at the time of connection. In this way, the deformation and repulsion of the resin core and the uniformity of the particle diameter of the resin core conductive particle facilitate the stabilization of the sandwiching of the conductive particles between the terminals; therefore, the connection state (bonding state) between the terminals becomes more stable than using the metal particles, and the stabilization of the conduction resistance can be expected. This is because the contact state between the terminal and the electrode is stabilized, and since the state (amount and area) of being solder-bonded to the electrode is secured, it is expected to have an effect of preventing the occurrence of a connection failure.

The solder particles can be appropriately selected from, for example, Sn—Pb, Pb—Sn—Sb, Sn—Sb, Sn—Pb—Bi, Bi—Sn, Sn—Cu, Sn—Pb—Cu, Sn—In, Sn—Ag, Sn—Pb—Ag, and Pb—Ag, as specified in JIS Z 3282-1999, depending on the electrode material and connection conditions. The lower limit of the melting point of the solder particles is preferably 110° C. or higher, more preferably 120° C. or higher, and still more preferably 130° C. or higher. The upper limit of the melting point of the solder particles is preferably 240° C. or lower, more preferably 200° C. or lower, and still more preferably 150° C. or lower. Heating the solder particles to a predetermined temperature promotes interdiffusion between metal atoms of the solder particles and metal atoms of the conductive layer, and interdiffusion between metal atoms of the solder particles and metal atoms of the terminals. The solder particles may contain the same metal as that contained in the resin core conductive particle, such as Ni. The solder particles containing the same metal as the resin core conductive particle are expected to have an effect of enhancing the affinity between the solder particles and the metal layer of the resin core conductive particle. The particle diameter of the solder particles is in the same range as that of the above-mentioned metal particles.

Further, the coated conductive particles may be formed by coating the surfaces of a resin particle serving as the core particle with solder particles. The coated conductive particles may be formed by coating the surface of a resin particle as the core particle with metal particles other than solder particles. By covering the surface of the resin particle with solder particles, the solder particles are melted by heating so that a conductive layer of solder can be formed on the surface of the resin particle. The coated conductive particles may be further coated with metal fine particles capable of easily interdiffusing metal atoms of the solder particles and metal atoms of the terminals as described above.

The coated conductive particles may be those obtained by coating the surface of the resin core conductive particle or the resin particle with a mixture of solder particles and a flux compound. Examples of the flux compound include a carboxylic acid such as levulinic acid, maleic acid, oxalic acid, malonic acid, succinic acid, glutaric acid, adipic acid, and sebacic acid. Using the flux compound can facilitate a good bonding state.

Further, as described above, the coated conductive particles may be those in which the surfaces of the conductive particles having protrusions described in the first to third configuration example are coated with metal fine particles, or may be those coated by mixing the insulating particles serving as protrusions with the metal fine particles. The Mohs hardness of the insulating particles is preferably greater than 7. Examples of the insulating particles include zirconia (Mohs hardness of 8 to 9), alumina (Mohs hardness of 9), tungsten carbide (Mohs hardness of 9), and diamond (Mohs hardness of 10), which may be used alone or in combination of two or more. Among these, alumina is preferably used from the viewpoint of cost. With the insulating particle having a high hardness, even in a case where the electrode surface has an oxide, the protrusions can penetrate the oxide thereby achieving a good bonding state.

The method described in Japanese Unexamined Patent Application Publication No. 2018-145418, for example, can be applied to the coating of the metal fine particles. Further, the present technology is not limited to the method described in the examples described below, and there is no particular limitation as long as similar effects can be obtained. In addition to the dry coating, a liquid component or a viscous liquid component may be mixed and coated by the same operation.

Connection Material

The connection material according to the present embodiment comprises coated conductive particles dispersed in an insulating binder. Examples of the connection material include a conductive adhesive which exhibits conductivity for connecting the first electronic component and the second electronic component, and an anisotropic conductive adhesive which exhibits conductivity only in the pressure application direction. The connection material can also be applied to a via material (filler) for connecting layers of a wiring board and a wiring material of a wiring pattern, among other applications.

Hereinafter, an anisotropic conductive adhesive will be described by way of example. The anisotropic conductive adhesive may be either an anisotropic conductive film (ACF) or an anisotropic conductive paste (ACP). An anisotropic conductive film is preferable from the viewpoint of ease of handling, and an anisotropic conductive paste is preferable from the viewpoint of cost. The lower limit of the thickness of the anisotropic conductive film may be, for example, the same as the particle diameter, and may preferably be 1.3 times or more of the particle diameter or 10 μm or more. The upper limit of the thickness of the anisotropic conductive film may be, for example, 40 μm or less or 2 times or less of the particle diameter. The anisotropic conductive film can be formed on a release film. The anisotropic conductive film may be laminated with an adhesive layer or a pressure sensitive adhesive layer containing no conductive particles, and the number of layers and the laminating surface thereof can be appropriately selected according to the object and the purpose. The insulating resin of the adhesive layer or the pressure sensitive adhesive layer may be the same as that of the anisotropic conductive film.

As the insulating binder (insulating resin), a known insulating binder can be used. Examples of the curing type include a thermosetting type, a photo-curing type, and a photo-thermosetting type. Examples include a photoradical polymerization type resin composition containing a (meth) acrylate compound and a photoradical polymerization initiator, a thermal radical polymerization type resin composition containing a (meth) acrylate compound and a thermal radical polymerization initiator, a thermal cation polymerization type resin composition containing an epoxy compound and a thermal cation polymerization initiator, and a thermal anion polymerization type resin composition containing an epoxy compound and a thermal anion polymerization initiator. Known adhesive compositions may also be used. The present technology is not limited to the above-described insulating binders (insulating resins). The (meth) acrylate compound in the following embodiment is also merely an example for explaining the invention.

In the present embodiment, a thermosetting insulating binder which is cured at a predetermined temperature for thermocompression bonding is suitable. Hereinafter, as specific examples, a thermal radical polymerization type insulating binder containing a film forming resin, an elastomer, a (meth) acrylic monomer, a polymerization initiator, and a silane coupling agent will be described. It should be noted that the term (meth) acrylic monomer includes both of an acrylic monomer and a methacrylic monomer.

The film-forming resin is not particularly limited and includes, for example, a phenoxy resin, an unsaturated polyester resin, a saturated polyester resin, a urethane resin, a butadiene resin, a polyimide resin, a polyamide resin, and a polyolefin resin, among others. The film-forming resin may be used alone or in combination of two or more. Among these, it is particularly preferable to use a phenoxy resin from the viewpoints of film forming property, processability, and connection reliability. The phenoxy resin is a resin synthesized from bisphenol A and epichlorohydrin, and may be suitably synthesized or may be a product commercially available. The content of the film-forming resin is not particularly limited, and is preferably, for example, 10 to 60 mass %.

The elastomer is not particularly limited and includes, for example, a polyurethane resin (polyurethane elastomer), an acrylic rubber, a silicone rubber, and a butadiene rubber, among others.

The (meth) acrylic monomer is not particularly limited, and may be, for example, a monofunctional (meth) acrylic monomer or a bifunctional or more multifunctional (meth) acrylic monomer. From the viewpoint of stress relaxation of the polymer, 80 mass % or more of (meth) acrylic monomers in the insulating binder are preferably monofunctional (meth) acrylic monomers.

From the viewpoint of adhesiveness, the monofunctional (meth) acrylic monomer preferably contains a carboxylic acid. The molecular weight of the monofunctional (meth) acrylic monomer having the carboxylic acid is preferably 100 to 500, more preferably 200 to 350. The content of the monofunctional (meth) acrylic monomer having the carboxylic acid in the insulating binder is preferably 3 to 20 mass %, more preferably 5 to 10 mass %.

The polymerization initiator is not particularly limited as long as it can cure the (meth) acrylic monomer at a predetermined temperature for thermocompression bonding, and examples thereof include an organic peroxide. Examples of the organic peroxide include lauroyl peroxide, butyl peroxide, benzyl peroxide, dilauroyl peroxide, dibutyl peroxide, peroxydicarbonate, and benzoyl peroxide, among others. These may be used alone or in combination of two or more. The content of the polymerization initiator in the insulating binder is not particularly limited, and is preferably, for example, 0.5 to 15 mass %. The predetermined temperature for thermocompression bonding can be determined on the basis of the reaction start temperature of the polymerization initiator and the polymerizable compound reacting therewith. This is because, in general, the predetermined temperature for thermocompression bonding is set higher than the reaction start temperature. The predetermined temperature for thermocompression bonding also depends on connection conditions such as connection time and reactivity (latency or life).

The silane coupling agent is not particularly limited and includes, for example, an epoxy-based silane coupling agent, an acrylic silane coupling agent, a thiol-based silane coupling agent, and an amine-based silane coupling agent, among others. The content of the silane coupling agent in the insulating binder is not particularly limited, and is preferably, for example, 0.1 to 5.0 mass %.

3. Method of Manufacturing Connection Material

The method of manufacturing a connection material according to the present embodiment includes the following steps A and B.

Step A

In step A, the above-described conductive particles and the metal fine particles are stirred to obtain coated conductive particles in which the conductive particles are coated with the metal fine particles. Further, by using conductive particles having a plurality of protrusions on the surface of the conductive layer, the protrusions act as cores of adhesion of the metal fine particles, thereby increasing the amount of adhesion of the metal fine particles.

The range of the particle diameters of the conductive particles and the metal fine particles are similar to the range described above for the coated conductive particles. Commercially available conductive particles and metal fine particles may be used. The conductive particles are preferably in a dry state from the viewpoint of coating with metal fine particles.

In step A, it is preferable to mix the conductive particles and the metal fine particles so that the amount of the metal fine particles relative to the conductive particles is, for example, less than 200 volume %. The amount (volume %) of the metal fine particles relative to the conductive particles may be a value obtained by the following equation.

Amount (volume %) of the metal fine particles (B) to the conductive particles (A)={(Bw/Bd)/(Aw/Ad)}×100

Aw: Mass composition (mass %) of the conductive particles (A)
Bw: Mass composition (mass %) of the metal fine particles (B)
Ad: Specific gravity of the conductive particles (A)
Bd: Specific gravity of the fine metal particles (B)

By satisfying these conditions, it is possible to easily coat the surfaces of the conductive particles with the metal fine particles in step A. It should be noted that the above conditions may also apply to a case where the liquid or viscous liquid component such as the flux compound is stirred simultaneously with the metal fine particles as described above.

The method of stirring the conductive particles and the metal fine particles may be either a dry method or a wet method, and the dry method is preferable. This is because the method used for known toners can be applied. Examples of the apparatus for stirring the conductive particles and the metal fine particles include a planetary type stirring device, a shaker, a laboratory mixer, and an stirring propeller. In particular, a planetary type stirring device having a high share is preferable from the viewpoint of coating the conductive particles with metal fine particles having a small particle diameter. In the planetary type stirring device, a container containing conductive particles and metal fine particles is revolved while rotating to produce a mixture containing coated conductive particles and metal fine particles.

Step B

In step B, the mixture containing the coated conductive particles and the metal fine particles and the insulating binder are stirred to obtain a connection material in which the coated conductive particles are dispersed in the insulating binder.

Further, in step B, the metal fine particles in the coated conductive particles may separate from the conductive particles due to friction or high share of the metal fine particles with the conductive particles; however, the separated metal fine particles are interposed between the coated conductive particles, thereby suppressing aggregation of the coated conductive particles.

Thus, by performing step B, aggregation of the coated conductive particles can be suppressed, and the coated conductive particles can be dispersed in the insulating binder. Further, since step B can be performed only by adding the insulating binder to the mixture containing the coated conductive particles and the metal fine particles obtained in step A, the same container and the same apparatus can be used, so that it is possible to reduce the material cost and the manufacturing cost.

It should be noted that the method of manufacturing the connection material according to the present embodiment may further include steps other than the above-mentioned steps A and B, if necessary. For example, in a case where the connection material is a film-like anisotropic conductive film, the method may include, for example, forming a film of an anisotropic conductive adhesive composition in which coated conductive particles are dispersed in an insulating binder by a coating method and drying the film.

4. Connection Structure

FIG. 1 is a cross-sectional view schematically illustrating a connection portion of a connection structure according to the present embodiment. The connection structure according to the present embodiment includes: a first electronic component 1 having a first terminal 1a, a second electronic component 2 having a second terminal 2a, and a cured film provided between the first electronic component 1 and the second electronic component 2 and formed by curing the aforementioned connection material, wherein, with regard to the coated conductive particles 3 between the first terminal 1a and the second terminal 2a, metal atoms of the conductive layer diffuse into the metal of the metal fine particles, and metal atoms of the first terminal and metal atoms of the second terminal diffuse into the metal of the metal fine particles. As a result, the metal of the first terminal and the metal of the second terminal are in a state of being metal-bonded and alloyed with the metal of the metal fine particles, thereby reducing and stabilizing the conduction resistance value. Although the anisotropic conductive connection in which the wiring of the electronic component has a line and space (L/S) has been described above, the terminal (wiring) of the electronic component may be a so-called solid pattern, and it may be used as a conductive connection without anisotropy and a conductive adhesive (not shown). It should be noted that the terminal may not necessarily have a convex shape as long as it is an electrically conductive portion to be electrically connected.

The first electronic component and the second electronic component are not particularly limited and can be appropriately selected according to the purpose. Examples of the first electronic component include a flexible printed circuit board (FPC), a glass substrate, and a plastic substrate. Examples of the second electronic component include a camera module, an IC (integrated circuit) module, and an IC chip. The second electronic component may be a functional module with a sensor mounted thereon. In the camera module, a ceramic substrate is sometimes used from the viewpoint of excellent electrical insulation and thermal insulation. The ceramic substrate and the functional module have advantages such as excellent dimensional stability in miniaturization implementation (for example, 1 cm$^2$ or less). Further, the connection structure according to the present technology can be used for any electronic device using electrical connection, such as a semiconductor device (including, in addition to driver ICs, all devices using semiconductor such as optical elements, thermoelectric conversion elements, and photoelectric conversion elements), a display device (monitors, television receivers, and head-mounted displays, among others), a portable device (tablets, smartphones, and wearable terminals, among others), a game console, an audio device, an imaging device (one using an image sensor such as a camera module), an electric device to be mounted on a vehicle (mobility device), a medical device, and a sensor device (touch sensor, fingerprint authentication, and iris authentication, among others).

Figure 2:
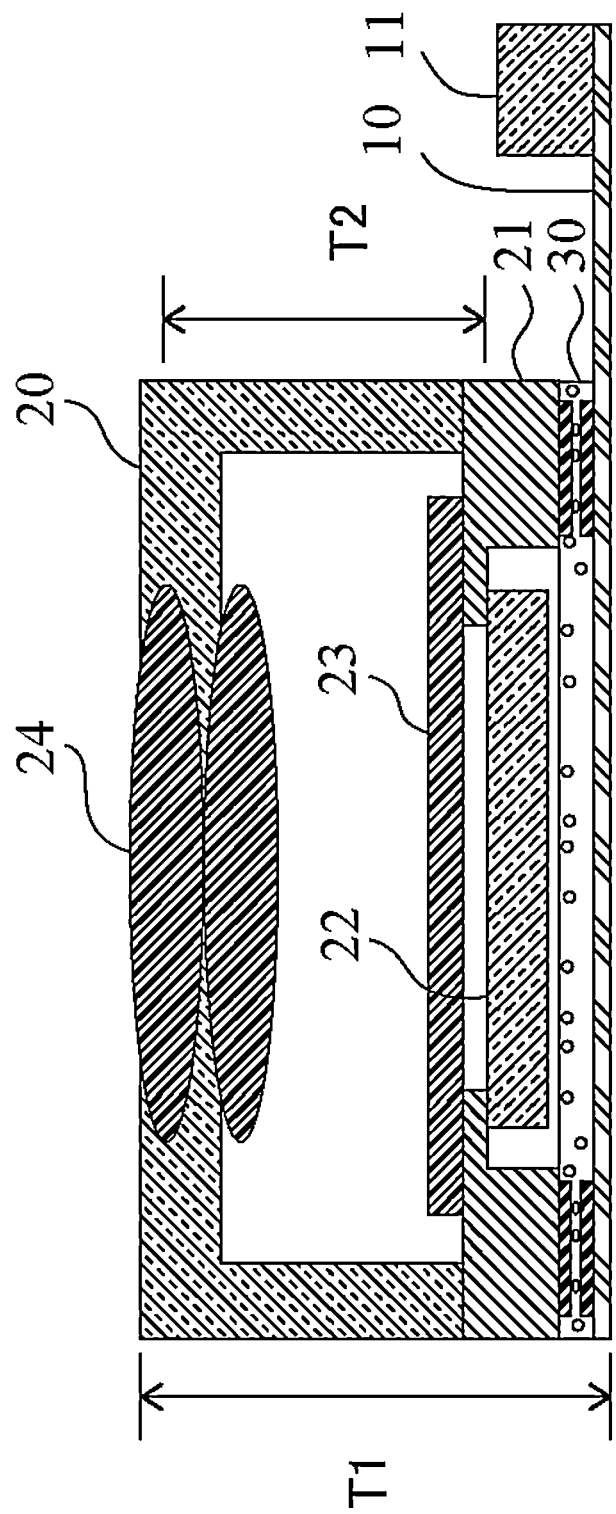
FIG. 2 is a cross-sectional view schematically illustrating a connection structure in which a camera module is mounted.

In the following, a connection structure in which a camera module is mounted will be described as a specific example. FIG. 2 is a cross-sectional view schematically illustrating a connection structure in which a camera module is mounted. As shown in FIG. 2, the connection structure includes a flexible substrate 10 having a first terminal, a camera module 20 having a second terminal, and a cured film 30 provided between the first terminal and the second terminal and formed by curing the aforementioned connection material.

The first terminal of the flexible substrate 10 is provided at a position facing the second terminal of the camera module. A camera module driving IC 11 may be mounted on the flexible substrate 10 outside the camera module mounting portion.

As shown in FIG. 2, the camera module 20 includes a ceramic substrate 21 having a concave portion (cavity) on the mounting surface and a second terminal on the periphery of the concave portion, an image sensor 22 housed in the concave portion, a protective glass 23 arranged above the image sensor 22 and fixed on the ceramic substrate 21, and a lens 24 arranged above the image sensor 22 and fitted in a housing. As shown in FIG. 2, the second terminal is formed on two opposing sides or three sides of the rectangular mounting surface of the ceramic substrate 21.

Figure 3:
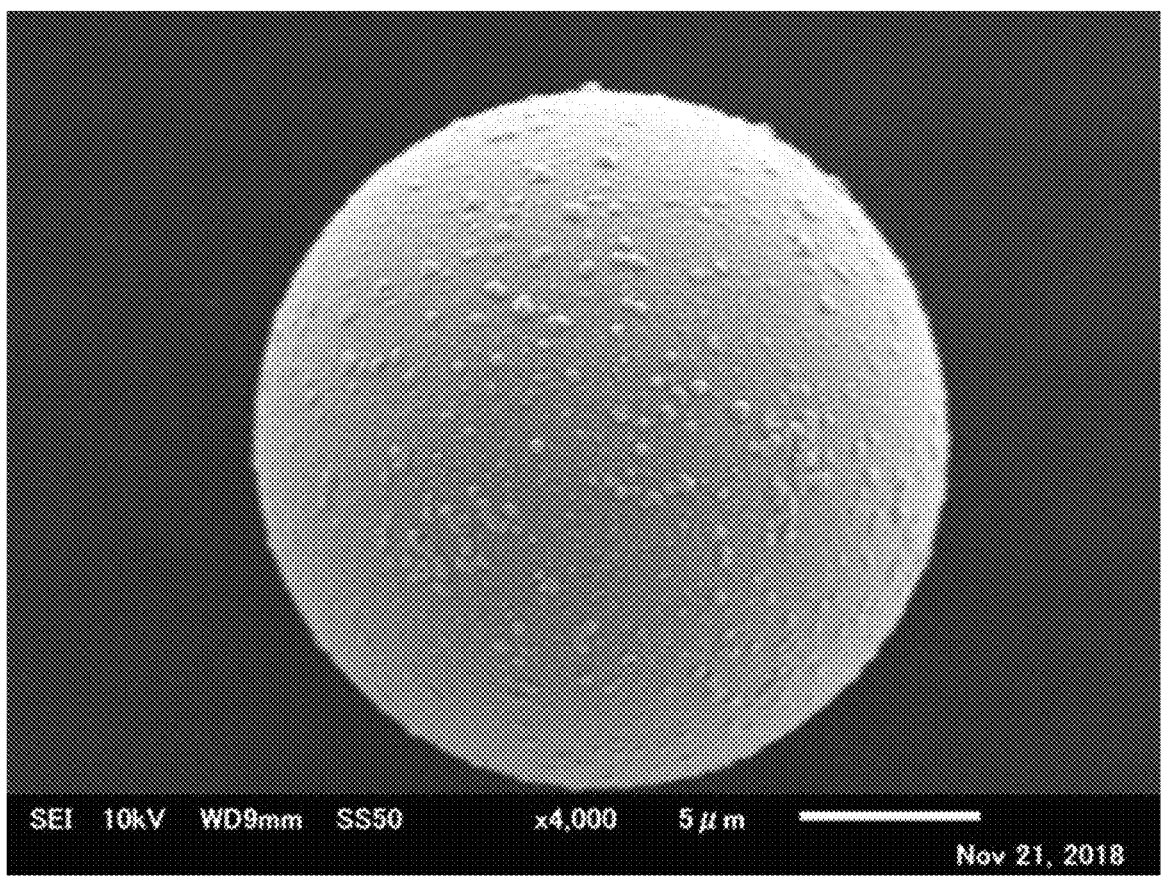
FIG. 3 is an SEM photograph of the resin core conductive particle (Ni (undercoat)/Au (surface) plating (Au=35 μm, Ni=210 nm), resin core, with protrusion) used in Example 2.

The cured film 30 is formed by curing the aforementioned connection material and obtained by, for example, as shown in FIG. 3, pasting an anisotropic conductive film 31 onto the rectangular mounting surface of the ceramic substrate 21, and conducting thermocompression bonding in a state in which the flexible substrate 10 is placed on the anisotropic conductive film 31.

According to the connection structure having such a configuration, the distance T1 between the image sensor 22 and the flexible substrate 30 can be reduced. It is difficult to optically reduce the distance between the image sensor 22 and the lens 24.

Further, since the camera module 20 has the concave portion on the mounting surface, the gas tends to accumulate in the concave portion after mounting, and when a reliability evaluation test is performed under a high atmospheric pressure, for example, the flexible substrate 10 might swell due to the influence of the gas. According to the present embodiment, metal atoms of the conductive layer of the coated conductive particles diffuse into the metal of the metal fine particles, and metal atoms of the first terminal and metal atoms of the second terminal diffuse into the metal of the metal fine particles. This promotes metal bonding and alloying so that the camera module 20 and the flexible substrate 10 are firmly bonded to each other, thereby keeping a low resistance stably. Therefore, signals can be stably transmitted to and received from the image sensor 22 so as to suppress noise of a captured image (electric signal).

In this technology, the metal of the conductive portion to be connected, the metal of the conductive layer of the conductive particles, and the metal of the metal fine particles coating the conductive particles can be appropriately selected according to the combination thereof. For example, the metal of the first terminal, the metal of the second terminal, and the metal of the conductive layer of the conductive particles are preferably of the similar type. This promotes metal bonding and alloying between similar metals and prevents migration between dissimilar metals. As an example of the configuration of the terminals, the first terminal and the second terminal are preferably formed by forming a nickel plating layer and a gold plating layer on a conductor in this order. Thus, when the conductive layer of the coated conductive particles is formed of a first conductive layer of nickel or a nickel alloy and a second conductive layer of gold or a gold alloy, and the metal fine particles are silver or a silver alloy, the gold atoms diffuse into the silver or the silver alloy by thermocompression bonding to form an intermetallic compound of gold and silver, thereby preventing migration of silver or nickel. The diffusion of metal atoms in the present technology seems to be influenced by free electrons of the metal, and it is inferred that the high mobility of the free electrons of the metal particles contributes to the alloying of the metal particles (silver in the above example) and the target metal (gold in the above example).

5. Method of Manufacturing Connection Structure

The manufacturing method of the connection structure according to the present embodiment includes: thermocompression-bonding a first electronic component having a first terminal and a second electronic component having a second terminal at a predetermined temperature via the above-mentioned connection material, and diffusing metal atoms of the conductive layer into the metal of the metal particulate, and diffusing metal atoms of the first terminal and metal atoms of the second terminal into the metal of the metal particles. This can reduce and stabilize the conduction resistance value. The predetermined temperature for thermocompression bonding is, for example, 200° C. or less, preferably 160° C. or less, and more preferably 140° C. or less. The temperature of 200° C. or less is a criteria provided from the viewpoint of an effect of suppressing thermal shock to an object member at the time of connection (for example, reduction of warpage of a substrate), and suppressing a strain after curing, which will be described later. In a case that a temperature of 200° C. or more is required for diffusing metal atoms of the first terminal, metal atoms of the second terminal, and metal atoms of the conductive layer of the conductive particles into the metal of the metal fine particles, the material and the thickness of the object member and the connection material may be selected by considering heat resistance at the time of connection. Since the predetermined temperature for thermocompression bonding is equal to or higher than the curing start temperature of the connection material, the predetermined temperature for thermocompression bonding can be determined by measuring the curing start temperature.

The temperature of the thermocompression bonding may be 200° C. or less at which metal diffusion occurs, preferably 160° C. or less, and more preferably 140° C. or less. Lower temperature of the thermocompression bonding is preferable in order to apply less thermal shock to the first electronic component and the second electronic component.

The first electronic component and the second electronic component are the same as the first electronic component and the second electronic component in the above-mentioned connection structure. The connection material is also the same as the connection material described above.

EXAMPLES

Examples of the present technology will be described below. In this examples, coated conductive particles using silver particles as metal fine particles were prepared. Then, a connection structure was fabricated using an anisotropic conductive film containing coated conductive particles, and conduction characteristics were evaluated. In addition, the cross-section of the connecting portion of the connection structure was observed.

Example 1

Preparation of Conductive Particles

A mixture containing coated conductive particles was prepared by introducing 3 parts by mass of resin core conductive particle (Ni (undercoat)/Au (surface) plating, resin core, without protrusions) having an average particle diameter of 20 μm and 1 part by mass of silver particles having an average particle diameter of 60 nm as metal particles into a planetary type stirring device (product name: Awatori Rentaro (ARE), manufactured by THINKY) and stirring them for 5 minutes.

Preparation of Anisotropic Conductive Film

An anisotropic conductive adhesive composition was prepared by introducing 5 parts by mass of a mixture containing coated conductive particles and 95 parts by mass of an insulating binder composed of the following components into a planetary type stirring device (product name: Awatori Rentaro (ARE), manufactured by THINKY) and stirring them for 1 minute. Then, the anisotropic conductive adhesive composition was applied to the PET film and dried in an oven at 80° C. for 5 minutes to form an adhesive layer comprising the anisotropic conductive adhesive composition on the PET film, thereby producing an anisotropic conductive film having a width of 2.0 mm and a thickness of 25 μm.

The insulating binder was prepared by mixing 47 parts by mass of phenoxy resin (product name: YP-50, manufactured by NSCC Epoxy Manufacturing), 3 parts by mass of monofunctional monomer (product name: M-5300, manufactured by TOAGOSEI), 25 parts by mass of urethane resin (product name: UR-1400, manufactured by Toyobo), 15 parts by mass of rubber component (product name: SG80H, manufactured by Nagase ChemteX), 2 parts by mass of silane coupling agent (product name: A-187, manufactured by Momentive Performance Materials Japan), and 3 parts by mass of organic peroxide (product name: NiperBW, manufactured by Nichiyu Corporation), into a mixed solution of ethyl acetate and toluene so that the solid content was 50% by mass.

Preparation of Connection Structure

A connection structure was prepared by thermocompression-bonding, via an anisotropic conductive film, a camera module evaluation substrate (ceramic substrate, 200 μm pitch, line:space=1:1, terminal thickness of 10 μm, Ni (undercoat)/Au (surface) plating, with cavity structure) and an FPC (polyimide Film, 200 μm Pitch, line:space=1:1, terminal thickness of 12 μm, Ni (undercoat)/Au (surface) plating). Thermocompression bonding was carried out by pressing down the tool from the FPC side through a silicon rubber having a thickness of 200 μm under the conditions of a temperature of 120° C., a pressure of 1 MPa, and a time of 6 second.

Example 2

An anisotropic conductive film and a connection structure were prepared in the same manner as in Example 1, except that 3 parts by mass of resin core conductive particle (Ni (undercoat)/Au (surface) plating, resin core, with protrusions) having an average particle diameter of 20 μm and 0.5 parts by mass of silver particles having an average particle diameter of 60 nm as metal particles were introduced into a planetary type stirring device to prepare a mixture containing coated conductive particles.

Example 3

An anisotropic conductive film and a connection structure were prepared in the same manner as in Example 1, except that 3 parts by mass of resin core conductive particle (Ni (undercoat)/Au (surface) plating, resin core, with protrusions) having an average particle diameter of 20 μm and 1 parts by mass of silver particles having an average particle diameter of 60 nm as metal particles were introduced into a planetary type stirring device to prepare a mixture containing coated conductive particles.

Comparative Example 1

An anisotropic conductive film and a connection structure were prepared in the same manner as in Example 1, except that 5 parts by mass of resin core conductive particle (Ni (undercoat)/Au (surface) plating, resin core, with protrusions) having an average particle diameter of 20 μm and 95 parts by mass of an insulating binder were introduced into a planetary type stirring device to prepare an anisotropic conductive adhesive composition.

Evaluation of Conductivity Characteristics

The conduction resistance value of the connection structure was measured with four-terminal sensing using a digital multimeter (manufactured by Yokogawa Electric Corporation) by flowing a current of 1 mA. After a reliability evaluation test under the conditions of a temperature of 121° C., a humidity of 100%, and an atmospheric pressure of 2 atm, the conduction resistance values of the connection structure were measured (12 hours and 24 hours after the test). The conduction resistance value of the connection structure was measured for 20 samples and 6 channels per sample (total 120 channels).

Table 1 shows the conduction resistance values (Maximum, Average, Minimum) of the connection structure in the initial state and after the reliability evaluation test (12 hours and 24 hours after the test).

TABLE 1

| | Comp. 1 | | | EX. 1 | | | EX. 2 | | | EX. 3 | | |
|---|---|---|---|---|---|---|---|---|---|---|---|---|
| | 0 h | 12 h | 24 h | 0 h | 12 h | 24 h | 0 h | 12 h | 24 h | 0 h | 12 h | 24 h |
| Maximum [Ω] | 0.29 | 0.33 | 1.16 | 0.24 | 0.20 | 0.18 | 0.20 | 0.16 | 0.15 | 0.16 | 0.16 | 0.15 |
| Average [Ω] | 0.20 | 0.22 | 0.23 | 0.19 | 0.16 | 0.15 | 0.16 | 0.15 | 0.14 | 0.14 | 0.14 | 0.14 |
| Minimum [Ω] | 0.14 | 0.16 | 0.16 | 0.14 | 0.14 | 0.13 | 0.15 | 0.13 | 0.13 | 0.13 | 0.13 | 0.13 |

As shown in Table 1, in Comparative Example 1 using protruded conductive particles not coated with silver fine particles, the difference between the maximum value and the minimum value of the conduction resistance value was large, and the difference between the maximum value and the minimum value of the conduction resistance value became larger after the reliability evaluation test. Further, in Comparative Example 1, the average value of the conduction resistance value increased after the reliability evaluation test.

On the contrary, in Example 1 using coated conductive particles in which the conductive particles without protrusions are coated with silver fine particles and Examples 2 and 3 using coated conductive particles in which the conductive particles with protrusions are coated with silver fine particles, the difference between the maximum value and the minimum value of the conduction resistance value was small, and the difference between the maximum value and the minimum value of the conduction resistance value became even smaller after the reliability evaluation test. In addition, in Example 1 to 3, the average value of the conduction resistance value decreased after the reliability evaluation test. This may be due to the wider diffusion of metals after the reliability evaluation test. It was also found that good results were obtained by mixing and stirring 3 parts by mass of conductive particles and 0.5 to 1.0 parts by mass of silver particles.

Cross-Section Observation of Connection Portion

Figure 4:
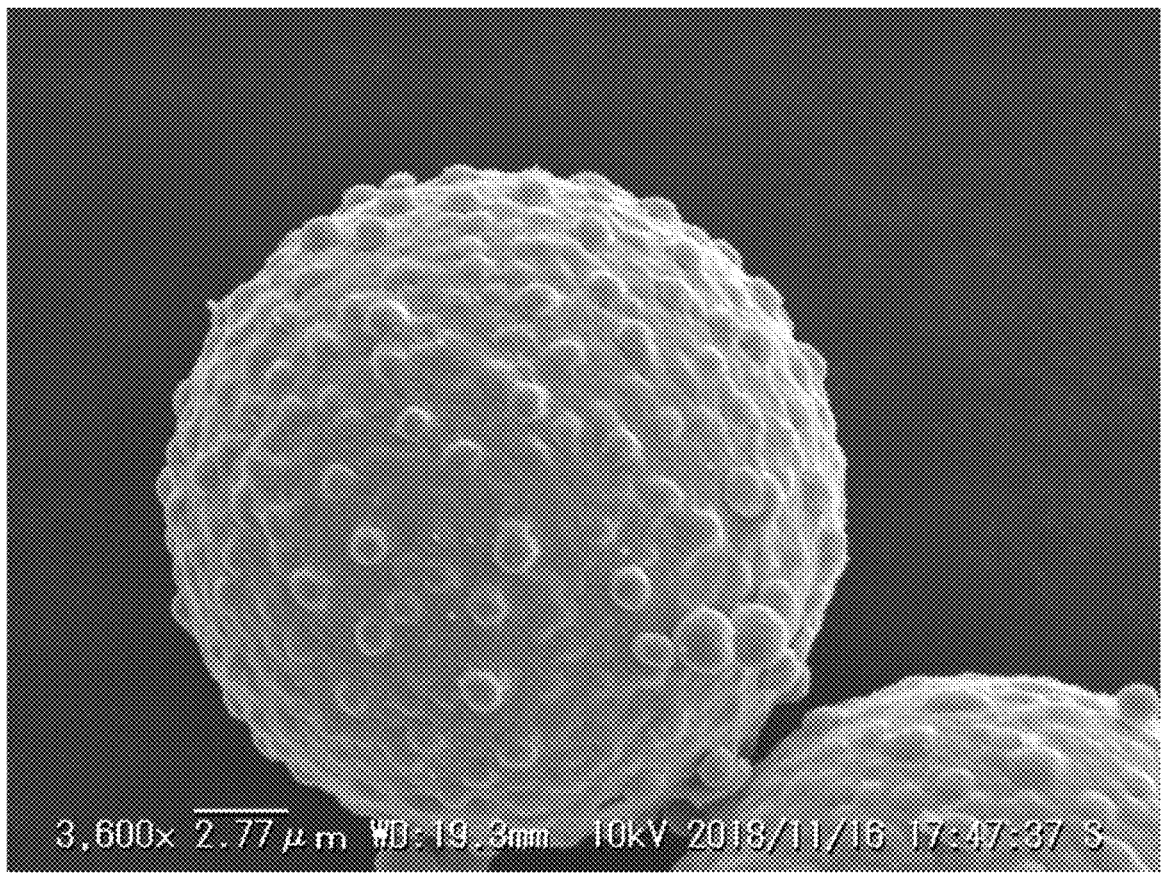
FIG. 4 is an SEM photograph of a coated conductive particle (metal particle: silver particle 60 μm) used in Example 2.

FIG. 3 is an SEM photograph of the resin core conductive particle (Ni (undercoat)/Au (surface) plating (Au=35 µm, Ni=210 nm), resin core, with protrusion) used in Example 2, and FIG. 4 is an SEM photograph of a coated conductive particle (metal particle: silver particle 60 µm) used in Example 2. FIGS. 3 and 4 show that silver particles adhere so as to cover the protrusions by mixing and stirring the conductive particles having protrusions and the silver particles.

Further, the diffusion state of the metals was observed by using a field-emission transmission electron microscope (FE-TEM) and an energy dispersive X-ray analyzer (EDS) to perform elemental mapping of contact portions between the coated metal particles and the terminals (Ni (substrate)/Au (surface) plating) on the ceramic substrate side in the connection structure of Example 2.

Figure 5:
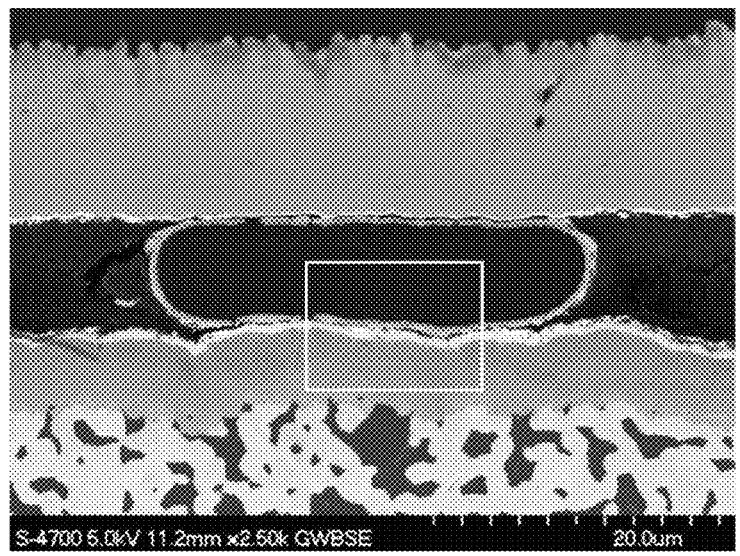
FIG. 5 is an SEM photograph of the cross section of the connection portion of the connection structure fabricated in Example 2.
Figure 6:
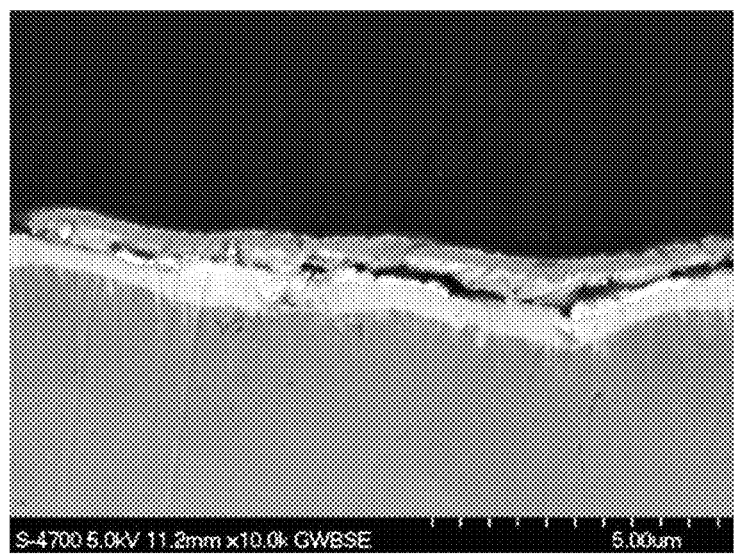
FIG. 6 is an enlarged photograph of the square portion shown in FIG. 5 on the side of the ceramic substrate.
Figure 7:
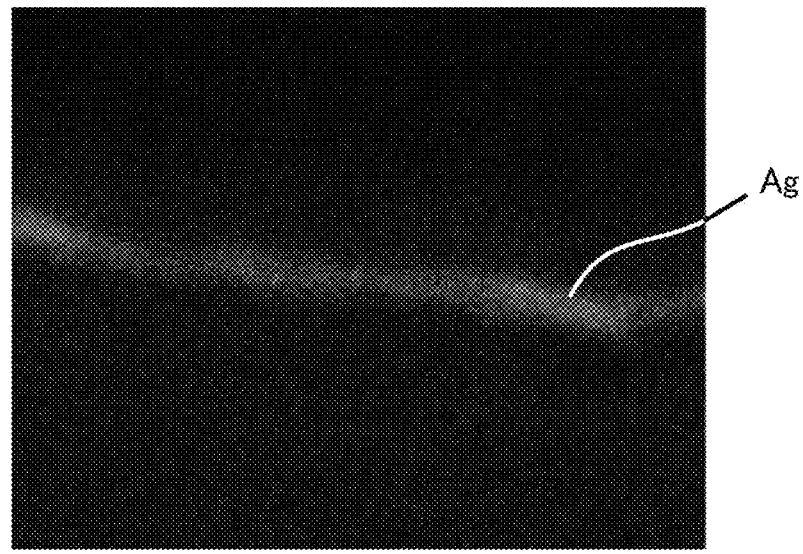
FIG. 7 is a mapping image of silver (Ag) in the enlarged photographic portion shown in FIG. 6.
Figure 8:
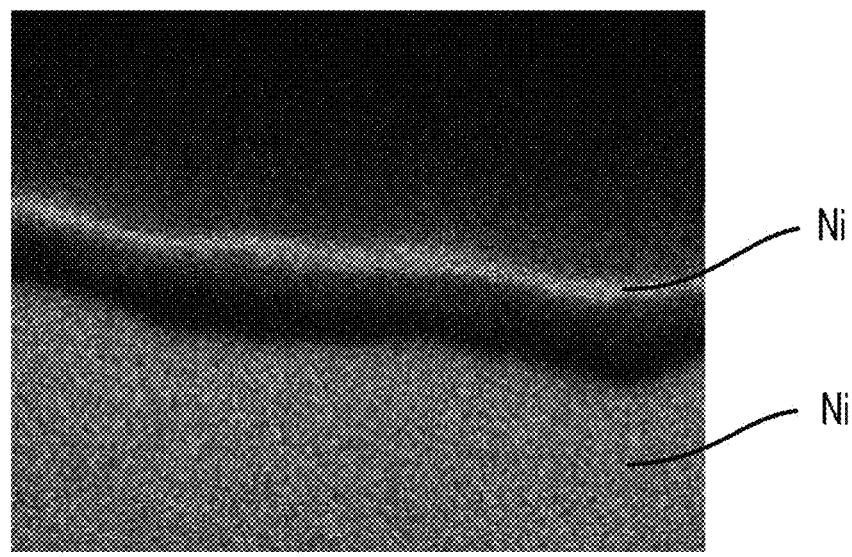
FIG. 8 is a mapping image of nickel (Ni) in the enlarged photographic portion shown in FIG. 7.
Figure 9:
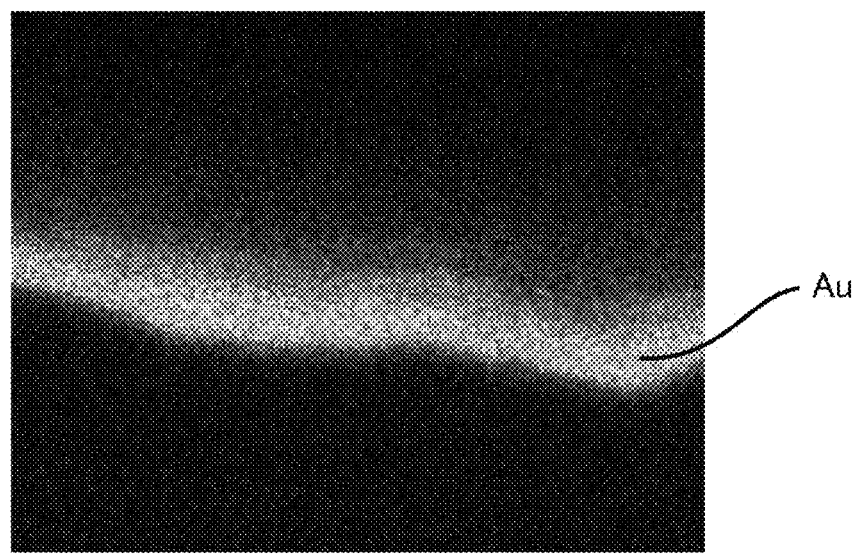
FIG. 9 is mapping image of a gold (Au) in the enlarged photographic portion shown in FIG. 8.

FIG. 5 is an SEM photograph of the cross section of the connection portion of the connection structure fabricated in Example 2, and FIG. 6 is an enlarged photograph of the square portion shown in FIG. 5 on the side of the ceramic substrate. FIG. 7 is a mapping image of silver (Ag) in the enlarged photographic portion shown in FIG. 6. FIG. 8 is a mapping image of nickel (Ni) in the enlarged photographic portion shown in FIG. 6. FIG. 9 is mapping image of a gold (Au) in the enlarged photographic portion shown in FIG. 6.

FIG. 7 shows that silver, which is a metal fine particle, exists in the contact portion between the coated metal particle and the terminal on the ceramic substrate side. In addition, FIG. 8 shows that a metal other than nickel exists between the nickel of the conductive layer of the coated metal particle and the nickel of the terminal on the ceramic substrate side. Further, FIG. 9 shows that gold diffuses into silver existing between nickel in the conductive layer of the coated metal particles and nickel in the terminals on the ceramic substrate side. In other words, it can be seen from FIGS. 7 to 9 that Au atoms of the Au plating of the terminals of the ceramic substrate and Au atoms of the Au plating of the conductive layer of the coated conductive particles diffuse into the Ag of the metal fine particles. It is presumed that this is because, due to the small particle diameter of the metal fine particles, the number of metal fine particles in contact with Au on the outermost surface of the conductive layer and Au on the outermost surface of the terminal increases to facilitate the diffusion of Au into Ag of the metal fine particles, and as described above, the relatively large mobility of free electrons in the metal of the metal fine particles affects the alloying of the conductive layer and the plating layer of the terminal.

In the above embodiment, the diffusion of the metal fine particles has been described, but the present invention is not limited thereto, and may include, for example, simple contact with the metal fine particles or alloying. Depending on the material of the metal fine particles, the objective may be achieved if the metal fine particles have an inter-conductive performance with the conductive layer of the resin core conductive particle or the conductive particles. Coating the coated conductive particles with the metal fine particles increases factors contributing to conduction, such as an increase in a contact point and a contact area of the metal fine particles to the conductive particles. The effect of diffusion of metal particles described above may be replaced by these factors.

DESCRIPTION OF REFERENCE CHARACTERS 1 first electronic component, 1first terminal, 2 second electronic component, 2a second terminal, 3 coated conductive particles, 10 flexible substrate, 11 camera module driving IC, 20 camera module, 21 ceramic substrate, 22 image sensor, 23 protective glass, 24 lens, 30 cured film, 31 anisotropic conductive film

What is claimed is:

1. A connection structure, comprising:
   a first electronic component having a first terminal;
   a second electronic component having a second terminal; and
   a cured film provided between the first electronic component and the second electronic component and formed by curing a connection material containing coated conductive particles comprising a core material particle, a conductive layer provided on the surface of the core material particle, and metal fine particles coating the surface of the conductive layer,
   wherein, with regard to the coated conductive particles between the first terminal and the second terminal, metal atoms of the conductive layer diffuse into the metal of the metal fine particles, and metal atoms of the first terminal and metal atoms of the second terminal diffuse into the metal of the metal fine particles,
   wherein the coated conductive particles have a plurality of protrusions on a surface of the conductive layer, and
   wherein the metal fine particles coat the surface of the protrusions and the surface of the conductive layer.

2. The connection structure according to claim 1, wherein the first or second electronic component is a camera module.

3. The connection structure according to claim 1, wherein the metal fine particles have a particle diameter of 2 nm to 100 nm.

4. The connection structure according to claim 1, wherein the metal fine particles have a particle diameter of 10 nm to 80 nm.

5. The connection structure according to claim 1, wherein the conductive particles have a particle diameter of 2 µm to 20 µm.

6. The connection structure according to claim 1, wherein the upper limit of t he particle diameter of the metal fine particles is 0.3% or less of that of the conductive particles.

7. The connection structure according to claim 1,
wherein the conductive layer has a gold-plated layer on the outermost surface; and
wherein the first terminal and the second terminal have a gold-plated layer on the outermost surface.

8. The connection structure according to any one of claim 7, wherein the first or second electronic component is a camera module.

9. The connection structure according to claim 1, wherein the core particle is composed of a resin particle.

10. The connection structure according to any one of claim 9,
wherein the conductive layer has a gold-plated layer on the outermost surface; and
wherein the first terminal and the second terminal have a gold-plated layer on the outermost surface.

11. The connection structure according to claim 9, wherein the first or second electronic component is a camera module.

12. A method of manufacturing a connection structure, comprising:
thermocompression-bonding a first electronic component having a first terminal and a second electronic component having a second terminal at a predetermined temperature via a connection material containing coated conductive particles comprising a core material particle, a conductive layer provided on the surface of the core material particles, and metal fine particles coating the surface of the conductive layer,
wherein the coated conductive particles have a plurality of protrusions on a surface of the conductive layer, and
wherein the metal fine particles coat the surface of the protrusions and the surface of the conductive layer; and
with regard to the coated conductive particles between the first terminal and the second terminal, diffusing metal atoms of the conductive layer into the metal of the metal fine particles, and diffusing metal atoms of the first terminal and metal atoms of the second terminal into the metal of the metal fine particles.

13. A connection material, comprising:
an insulating binder in which coated conductive particles comprising a core particles, a conductive layer provided on the surface of the core particles, and a metal particles covering the surface of the conductive layer are dispersed,
wherein the coated conductive particles have a plurality of protrusions on a surface of the conductive layer,
wherein the metal fine particles coat the surface of the protrusions and the surface of the conductive layer, and
wherein metal atoms of the conductive layer diffuse into the metal of the metal fine particles at a predetermined temperature for thermocompression bonding.

14. The bonding material according to claim 13, which is an anisotropic conductive adhesive.

15. The connection material according to claim 13, which is an anisotropic conductive film.

16. A coated conductive particle, comprising:
a core particle;
a conductive layer provided on the surface of the core particle; and
metal fine particles coating the surface of the conductive layer,
wherein the coated conductive particles have a plurality of protrusions on a surface of the conductive layer,
wherein the metal fine particles coat the surface of the protrusions and the surface of the conductive layer, and
wherein metal atoms of the conductive layer diffuse into the metal of the metal fine particles at a predetermined temperature for thermocompression bonding.

* * * * *